United States Patent [19]

Laude

[11] Patent Number: 5,409,741
[45] Date of Patent: Apr. 25, 1995

[54] METHOD FOR METALLIZING SURFACES BY MEANS OF METAL POWDERS

[76] Inventor: Lucien D. Laude, Rue des Lilas, 64, 59330 Hautmont, France

[21] Appl. No.: 836,650

[22] Filed: Feb. 14, 1992

[30] Foreign Application Priority Data

Apr. 12, 1991 [BE] Belgium .............................. 09100336

[51] Int. Cl.⁶ .............................................. B05D 3/06
[52] U.S. Cl. ..................................... 427/555; 427/198; 427/201; 427/203; 427/205; 427/264; 427/265; 427/270; 427/275; 427/276; 427/284; 427/289; 427/307; 427/357; 427/367; 427/380; 427/383.1; 427/443.1; 427/553; 427/554; 427/556
[58] Field of Search ............... 427/198, 201, 203, 205, 427/443.1, 380, 383.1, 307, 554, 555, 553, 289, 357, 367, 264, 265, 270, 275, 276, 284, 556

[56] References Cited

U.S. PATENT DOCUMENTS 4,278,712  7/1981  Thomann ........................... 427/304
4,634,468  1/1987  Gulla et al. ........................ 106/1.11

FOREIGN PATENT DOCUMENTS 62-124278  6/1987  Japan .
63-310972  12/1988  Japan .
2-305969  12/1990  Japan .

*Primary Examiner*—Bernard Pianalto
*Attorney, Agent, or Firm*—Stroock & Stroock & Lavan

[57] ABSTRACT

The method for metallizing the surface of dielectric materials according to the invention comprises a first step wherein a metal powder, the size of the grains of which is comprised between 10 and 5000 nm, is deposited and then incorporated into the surface of the dielectric material. In a second step of the method, the dielectric material which is so impregnated with metal, is immersed into an autocatalytic bath to coat the impregnated zones of the material with a layer of the metal contained in the bath in a thickness which is proportional to the immersion time. This method enables to metallize materials such as oxides, polymers and composites containing these oxides and/or these polymers. The characteristics of the metal deposits are controlled, on the one hand, by the type of metal, and the size and the geometry of the metal powder grains and, on the other hand, by the type and the structure of the dielectric materials coated with these deposits.

28 Claims, No Drawings

METHOD FOR METALLIZING SURFACES BY MEANS OF METAL POWDERS

The methods for metallizing surfaces described in this invention are a) mainly characterized by the use of metal powders as initial metallization agents for these surfaces and, secondly, b) by different techniques allowing to integrate, in a chemical, thermal or mechanical way, these powders into the surface, or over a small depth, of materials which are moreover difficult to metallize, such as for example the electric insulators (ceramics, glasses, plastics). Optionally, this initial metallization can be confined to reduced zones of these surfaces by irradiating by means of a laser beam displaced over the surfaces. Independent of the integration technique of the used powders, which allows to realize the initial metallization of the surfaces, these surfaces are subsequently coated, only in the initially metallized zones, with a metal layer having a variable thickness upto several hundreds micrometers by using the known electrolysis methods for depositing metals onto metal or metallized substrates (with or without electric polarization of the substrate with respect to the electrolysis bath).

It is industrially particularly most desirable to metallize the surface of dielectric materials which are moreover electric insulators. In order to be efficient and industrially workable, this metallization must produce very adherent films, irrespective of their thickness, onto any dielectric substrate and irrespective of the state of its surface (polished, rough, crystallized or amorphous). The application of metallization is found in metallurgy; hardening of surfaces and abrasion resistance; electronics; interconnection of hybride circuits; optics; metallization of mirrors; chemistry; passivation to chemical agents. The most interesting materials include; alumina, silica, ferrites, polymers and any composite of these materials.

The most important difficulty for metallizing these materials is caused by their chemical nature. Indeed, they are composed of atoms which are interconnected by very strong covalent or ionic bonds. Due to these bonds on their surface, any foreign atom which is depositied thereon is linked in this way to this surface only by dipolar forces, which are therefore relatively weak with respect to the intrinsic interatomic forces at the surface of the substrate. This physisorbtion is generally responsible for the low adherence of the films obtained by vacuum evaporation, in particular onto a dielectric substrate.

The adherence of the metal films can be increased in two ways: a) by increasing the effective contact surface between the film and the substrate; or b) by modifying the chemistry of the film/substrate interface. The first way is of a structural nature. It consists in making the surface of the substrate rough prior to the deposit (in a conventional way) of a metal film. The second way (or chimisorption) implies the formation of strong bonds between the surface atoms, on the one hand, and the foreign atoms which are deposited thereon, on the other hand. In accordance with these two ways, the deposition of the film is followed by a heat treatment of the film/substrate combination in order to improve the homogeneity of the interface. This heat treatment is practically impossible to perform onto plastics.

Any metallization process comprises a metal source and an energy source. Amongst the various used techniques, the cathodic sputtering deposition allows to obtain the best adherence onto an insulating substrate. Unless use is made of a mask, this technique can however not be used for realizing very strongly limited deposits or deposits which are reproduced in a too small number. Recently, a new process has been developed which consists in using a metal-organic compound condensed in thin film onto the surface to be metallized. This film is irradiated by means of a laser beam to decompose the compound. When the volatile portion of the metal-organic molecule is eliminated from the surface, the metal on liberated by the decomposition, remains on this surface. In this way, the surface is partially metallized. It can then be coated with a thick metal film through a conventional electrolysis. This process presents the drawback that the metal-organic film has to be applied in advance, which is difficult to perform when the surface to be coated is not flat or has a very jagged geometry. It means also a supplementary step with respect to all the other film deposition methods. For treating this film, use can be made of an $Ar^+$ ion laser or an excimer laser.

The method which is the subject of the present invention brings about an important progress with respect to the existing methods for metallizing the surfaces of electrically insulating materials which are thermally refractory or which have, on the contrary, a small heat capacity and a small thermal diffusivity. The metal source is directly a powder of the metal that is to be applied onto the surface. This metal can be easily applied onto the surface as a liquid solution, and not by vacuum evaporation. The treatment of this same metal deposit is realized in open air, advantageously by excimer laser irradiation but also in other less expensive ways, in particular in a thermal way in an open oven (in particular a micro wave oven). The laser treatment offers the possibility to treat the film discretely by scanning the (either or not previously focalized) laser beam according to the known optical techniques. Finally, the method allows to metallize a surface with any metal, in so far as the latter can be prepared in the form of a powder, having advantageously a grain size smaller than 100 nm. The whole of these characteristics can be extended to very diverse materials such as glasses and plastics, without any particular adaptation. The method is therefore a universal method for these materials, in contrast to the other methods. Bringing it into practice is extremely simplified which allows to automize the method at very low cost with respect to the other methods for a very superior effectiveness as to the adherence.

The method described in this invention consists in using, as a metal source, a powder composed of grains having a variable size, comprised between 10 and 5000 nm, preferably between 20 and 100 nm, and an energy source represented by a laser beam, preferably an excimer laser beam. In a first step, the metal powder is introduced into a volatile liquid, such as for example chloroform, so as to form a suspension. This suspension can then be applied by dabbing with a pad or in any other way onto the surface to be coated. The piece to be metallized can further also be immersed totally into the suspension and then removed into the air. After separating the volatile material (by evaporation), the metal particles remain fixed onto the surface of the substrate in the shape of a solid film. Irradiating with the laser beam therefore serves two objectives: a) processing the substrate, either thermally (ion laser, for example), or by irradiating at an appropriate wavelength, or by ablation (excimer laser), and b) transferring energy to the metal particles in order to allow them to migrate inside the substrate.

According to the type of the substrate, one selects the laser radiation which enables the best optical coupling with this substrate. This coupling can be brought about thermally (with an ion laser working in the visible) via the transfer of photonic energy onto the impurity sites or faults in the ceramics (alumina, silica, composite) or electronically (with an excimer laser working in the ultraviolet) by exciting valence electrons. In the latter case, the choice of the emission wavelength of the excimer laser depends on the optical absorption threshold of the irradiated material, for example 193 nm for quartz. As will be shown in the different application examples which are described hereinafter, the method is particularly well adapted to polymer materials which have a small heat capacity (degradation at a temperature lower than 300° C.) and a small thermal diffusivity, such as for example polycarbonate which can be very advantageously irradiated at 308 or 248 nm. It enables also to engrave and to metallize successively and with the same geometry "hard" dielectrics (quarts, alumina) by integrating into these materials upto a depth which can reach 1 mm, thick, very adherent metal tracks (~0.5 mm) which can meet very high specifications.

Finally, the type of dielectric substrate ("hard" or "soft") determines the choice of the size of the metal grains of the used powder. This choice allows in particular a very dense "coating" of the irradiated zones, so that a first metal layer which is very adherent to the substrate is obtained. In particular, as the duration of the pulses of an excimer laser does not exceed 30 nsec, the optical coupling of this laser beam with a polymer can be chosen so as to induce either ablation, crystallization, cross-linking or melting of the plastic, and simultaneously, a very intense coupling, in any situation, with the metal particles. These particles are brought in this way to a high temperature for a very short time during which they penetrate into a polymer matrix undergoing transformation. This penetration presents a gradient over several microns in the polymer, forming in this way a very effective metal attachment layer without carbonisation of the polymer material. As it will be shown in the given examples, this method is not specific to one metal but is applicable to any metal as long as it is used in a powder form.

For all the various production schemes of this preliminar metal attachment layer, the so coated substrates are immersed then in an electrolysis bath without polarization (i.e. "electroless") in order to increase the thickness of the previously deposited metal film. This second deposit takes place solely in the previously metallized (i.e. irradiated) zones.

Several forms of the method presented in this invention are described in the following examples which relate to the metallization of glasses or plastics. These examples are not limitative and can be extended to other dielectric materials without departing from the general principles described hereinabove.

EXAMPLE 1

Printing a Metal Powder Onto a Glass Surface by Means of a Laser

A glass substrate is coated with a metal film by spinning. The used suspension is composed of chloroform containing a suspended metal powder. After evaporation of the volatile liquid, the glass is coated with a discontinuous deposit of metal grains (of copper, for example) having an average diameter of 80 nm, and then exposed to a laser beam. Two laser types have been used: a. A+ion laser (wave length=514 nm). The metal film absorbs the laser light and its temperature increases. Consequently, the glass substrate is heated up itself and this localised heating of the substrate generates a mechanical stress in this substrate which results in the formation of microcracks on its surface. These cracks capture the metal particles which migrate in this way towards the inside of the glass substrate. Typically, the used laser power is 4 W, and the diameter of the beam at the impact onto the glass is 200 $\mu$m. The beam is displaced at 1 mm/sec over the surface. The method produces metallized bands of copper (copper powder having a diameter of 80 nm) onto the glass surface, with a penetration comprised between 1 and 5 $\mu$m. b. KrF excimer laser (wavelength=248 $\mu$m). The optical absorption takes place at the same time on the metal grains and on the glass. For an energy density near 1 J/cm$^2$, the laser irradiation results in that the metal powder of copper (diameter=80 nm) is impressed into the glass. This impression is inhomogeneous here, the irradiation is accompagnied by the formation of a "plume" of material emitted by the film in the beam axis. At a higher energy level, on observes only ablation of material and at a lower energy level, no impression is obtained.

EXAMPLE 2

Transfer of Metal Powder Onto a Glass

A film is prepared onto a quartz plate in the same way as in Example 1. The glass substrate is applied against this plate or is disposed at a very small distance from the latter. The metal film on quartz is placed on the side of the glass substrate. The quartz plate is then irradiated, through a mask, on the side not coated by the film. Due to this irradiation, the metal on the opposite face of the quartz is emitted towards the glass substrate which is coated in this way with a film, the geometry of which corresponds exactly to the one of the mask. Thereupon, this film is autocatalytically coated with a thicker film of a metal which is either identical or not to the first deposited metal.

EXAMPLE 3

Engraving of a Glass Plate With a Laser and Coating of the Engraving With a Metal Powder A glass plate having a thickness which can reach up to several millimeters is irradiated in advance by means of an excimer laser working at a wavelength of 248 nm. Microcracks are produced on its surface in a very dense network extending onto a depth of 300 nm within the glass for an energy of 1 J/mm$^2$. After repeated irradiation by a train of superimposed pulses onto the same irradiated zone, these cracks are multiplied. At the end of about 100 pulses, a groove is cut within the glass over a depth of some micrometers. The inner surface of this groove is coated with cracks having a width of about 50 to 100 nm. A suspension of metal powder in chloroform, the grains of which have a diameter comparable to the dimension of the cracks (here for example 80 nm) is then spreaded over the glass. The metal particles become encrusted in these cracks where they are trapped, whereas the particles deposited outside the grooves are easily eliminated by rubbing with a fabric or with a flat equipment since they are weakly bonded to the glass. The piece of glass is then immersed into a chemical plating solution containing nickel ions, the composition of which is known per se. These ions condense then in the grooves, in contact with the metal particles previously encrusted into these grooves. Adjacent or mutually crossing grooves can be filled in this way with different metals. To this end, a first groove is coated with a ribbon of nickel. As nickel is catalytically active with respect to a metal deposit of Cu, this Ni ribbon has to be electrically insulated. This is realized by immersing the glass piece into a chloroform solution where an amount of polymethyl methacrylate (PMMA) is dissolved in advance. The piece is withdrawn from the solution and the chloroform is evaporated so that a layer of PMMA remains (having a thickness which can be in the range of 5 to 20 μm). A second groove is then engraved into the glass in such a manner that it intercepts the first groove. This groove is engraved by irradiating the surface covered by PMMA by means of an excimer beam working at 248 nm, which ablates the PMMA and the glass thereunder in the irradiated zone. The second groove is then impregnated with a suspension containing a Cu powder (diameter of the grains=30 nm). After immersion into an electrolytic solution containing copper ions, this second groove is then occupied by a copper ribbon which intercepts the first nickel ribbon. The PMMA enables here to avoid any copper deposit outside the zones irradiated during the second irradiation. The remaining PMMA is then eliminated from the surface by immersing the piece into a bath of a specific solvent for PMMA (chloroform or acetone). In this way, there is produced a Cu-Ni thermocouple engraved on the glass plate and the active surface of which corresponds to the superposition zone of the two ribbons of Ni and Cu respectively. This zone has a surface which is only limited by the size of the excimer laser beam used for the engraving. It can have a dimension comprised between 50 and 500 μm.

When these two ribbons are exactly superimposed, a supplementary laser or thermal treatment allows also to prepare thick linear deposits of alloy.

EXAMPLE 4

Fixation of a Metal Powder onto the Surface of a Solid Polymer

Use is made of a copper powder, with a grain average diameter of 80 nm. A suspension of this powder is prepared in a vessel containing chloroform and powder in an amount of 1 cm$^3$ powder for 50 cm$^3$ chloroform. The particles agglomerate together in the shape of balls having a diameter in the range of some tens of micrometers. In order to eliminate these agglomerates, the vessel containing the suspension is partially immersed into an ultrasonic bath. After a few seconds of immersion, the dispersion of the particles is maximum and the agglomerates have disappeared. A fraction of the suspension is then taken and subsequently distributed over the surface of a piece of PBT which is maintained horizontally. The piece can also be immersed into the suspension and then removed. After evaporation of the chloroform, a thin metal layer is then fixed weakly to the surface of the PBT. This surface is irradiated thereafter with a Ar+ laser beam swept over the surface after being focalized to reach a power density of about 0.3 W/cm$^2$ at the impact onto the surface. During the irradiation, the metal particles heat up and the surface layer of the polymer melts over a depth of some micrometers. These particles diffuse over this depth, which allows to impregnate the polymer very strongly with the metal of the initial suspension.

After irradiation, the piece of PBT is immersed in an ultrasonic water bath for 5 minutes, so that the metal particles which are weakly fixed onto the non-irradiated surface of the piece of PBT, are detached. The so-collected particles can be re-used again for coating another piece by the hereinabove described method.

After the cleaning in the ultrasonic bath, the piece is then immersed into a chemical plating solution having the following composition (for 1 l water):

| | |
|---|---|
| CuSO$_4$ | 25 to 35 g |
| NaOH | 30 to 40 g |
| Na$_2$CO$_3$ | 20 to 30 g |
| EDTA | 80 to 90 g |
| Formol | 20 to 25 ml. |

A metal deposit of copper is developed then starting from (and around) the metal particles integrated into the surface of the PBT during the first part of the method. The deposit rate is in the range of 10 μm/hour. The same result is obtained on a glass plate with a laser power density of 1 W/cm$^2$.

EXAMPLE 5

Metallization Of a Polymer Substrate By Using a Solvent Of The Polymer

In contrast with example 4, the suspension of the metal powder is performed here in a solvent which is specific to the polymer to be metallized.

In order to metallize the surface of a piece of polycarbonate, a suspension of zinc powder (average size of the metal particles: 10 μm) is prepared in DMPhA, according to a variable proportion. The DMPhA containing the powder is then spread out over the surface of the polycarbonate. Before the solvent is completely evaporated, the surface is etched and the zinc particles are integrated in this way near the surface. The so-treated piece is next immersed into the following solution (for 1 l water):

| | |
|---|---|
| NiCl$_2$ | 30 g |
| NaH$_2$PO$_2$ | 10 g |
| NaCH$_3$COO | 10 g. |

The temperature of the solution is brought to 95° C. and the deposit rate of nickel is in the range of 10 to 50 μm/hour over the whole surface impregnated previously with zinc powder.

EXAMPLE 6

Metallization Of a Polymer Substrate Or a Polymer Composite By Using a Micro-Wave Oven A suspension containing a metal powder is prepared according to the method described in example 4. This suspension is applied onto the surface of a piece of whatever polymer, either by dabbing with a pad through a mask applied onto the piece, or by applying with the tip of a felt-tip pen impregnated with the suspension. The so-prepared piece is placed in a microwave oven giving 500 to 800 W, during a period varying from seconds to minutes. Only the metal particles pick up the radiation emitted by the oven and heat up consequently. The polymer substrate melts locally in contact with the particles which diffuse in this way deep into the polymer. The average penetration depth of the particles into the polymer is directly proportional to the residence time of the piece in the oven kept at a fixed working power. This depth depends also on the size of the particles: it increases with the diameter of the particles. After the treatment in the oven, an "electroless" deposit is performed.

In this way, a polycarbonate piece can for example by metallized with a copper powder having a diameter of 80 nm.

EXAMPLE 7

Metallization Of a Polymer Substrate Or a Polymer Composite By Hot Pressing

The metal powder is deposited onto a polymer substrate as in example 4. Next, the totallity or a portion of the metal layer, which is weakly adherent to the polymer, is treated by a hot tool applied onto this surface. This makes the metal particles to penetrate into the substrate over the whole contact surface.

After hot pressing, the treated piece is immersed in an ultrasonic bath to eliminate the particles which are not treated by the hot pressing from the piece. This piece is then immersed in an "electroless" bath to produce a metal deposit only in the zones of the piece which were previously impregnated at a high temperature with metal powder.

In this way, a sheet of PA 6.6 (any thickness) is metallized with a Cu powder (having a particle diameter of 80 nm), followed by an "electroless" deposit of nickel or copper. The particular embodiment of the invention described in this example is well adapted to a continuous assembly line metallization of a plastic sheet according to a track having a width comprised between 50 μm and 1 mm.

What is claimed is:

1. A method for metallizing a dielectric surface of a dielectric material comprising:
providing a dielectric material having a surface;
impregnating a first metal in powder form having a grain size of between about 10 nm and 5000 nm into the surface of the dielectric material to form a plurality of metal impregnated zones on the surface of the dielectric material; and
immersing the dielectric material impregnated with the metal powder into an autocatalytic bath containing a second source of metal and forming a metal layer on the impregnated zones on the surface of the dielectric material.

2. The method as claimed in claim 1, wherein the metal source of the autocatalytic bath contains the same metal as the metal powder impregnated into the surface of the dielectric material.

3. The method as claimed in claim 1, wherein the metal source of the autocatalytic bath contains a different metal from the metal of the powder impregnated into the surface of the dielectric material.

4. The method as claimed in claim 1, wherein the surface is impregnated with the metal powder by combining the metal powder with a liquid having a volatile portion to form a suspension; coating the surface of the dielectric material with the suspension; and permitting the volatile portion of the suspension to evaporate.

5. The method as claimed in claim 4, wherein the liquid containing the metal powder is a liquid capable of chemically corroding the surface of the dielectric material.

6. The method as claimed in claim 4, wherein the surface of the dielectric material is irradiated by a laser beam after the volatile portion of the suspension has evaporated.

7. The method as claimed in claim 4, wherein the surface of the dielectric material is exposed to microwaves after the volatile portion of the suspension has evaporated.

8. The method as claimed in claim 4, wherein the dielectric material is transparent to laser radiation and has a first surface impregnated with the metal powder and a second surface and including the steps of contacting the first surface of the dielectric material with the liquid suspension; and irradiating the metal powder impregnated in the first surface of the dielectric material by passing a laser beam through the second surface of the dielectric material.

9. The method as claimed in claim 4, including the step of imbedding the metal powder into the surface of the dielectric material by applying a force with a stamp or punch to the surface of the dielectric material impregnated with the metal powder.

10. The method as claimed in claim 9, wherein the punch or stamp has a surface which is heated to a sufficient temperature so that the metal powder impregnated in the dielectric surface is melted by the punch or stamp.

11. The method as claimed in claim 4, wherein the dielectric material has a first flat surface and a second flat surface and is transparent to laser radiation, and including the steps of: providing a contact member having a flat surface; contacting the first flat surface of the dielectric material impregnated with the metal powder with the surface of the contact member; and irradiating the first flat surface of the dielectric material by passing radiation through the second flat surface of the dielectric material so that the metal powder impregnated onto the first flat surface of the dielectric material is transferred onto the surface of the contact member.

12. The method as claimed in claim 11, wherein the contact member is a dielectric material.

13. The method as claimed in claim 11, wherein the contact member is not a dielectric material.

14. The method as claimed in claim 1, further including the steps of engraving the surface of the dielectric material to form grooves on the surface prior to impregnating the surface of the dielectric material with the metal powder.

15. The method as claimed in claim 14, wherein the surface of the dielectric material is mechanically engraved to form grooves for receiving the metal powder by contacting the surface of the dielectric material with a tool in a predetermined path on the dielectric surface.

16. The method as claimed in claim 15, wherein the metal powder has a grain size of less than 100 nm.

17. The method as claimed in claims 15, wherein the surface of the dielectric material having the metal powder disposed within the grooves formed by engraving is exposed to heat prior to immersion of the dielectric material into the autocatalytic bath.

18. The method as claimed in claim 14, wherein the dielectric surface is engraved by a laser beam to form grooves to receive the metal powder.

19. The method as claimed in claim 18, wherein the metal powder has a grain size of less than 100 nm.

20. The method as claimed in claim 14, wherein the grooves on the surface of the dielectric material for receiving the metal powder are limited by the lateral dimensions of the means for engraving the surface of the dielectric material.

21. The method as claimed in claim 1, wherein the metal powder is derived from a metal or an alloy selected from the group consisting of Ni, Cu, Ni-Co, Ni-Cu, Ni-Fe, Ni-Re, Ni-Co-Re, Ni-W, Co-W, Ni-Co-W, Co-Zn, Co-Fe, Co-Re, Cu-Co, Co-Mo, Co-Mn, Ag, Au, Pd, Pt, Sn, Cr, Cd, Fe, and Pb.

22. The method as claimed in claim 1, wherein the process of impregnating, immersing and coating is repeated a plurality of times and wherein at least one of the plurality of times the metal or alloy is different so that a plurality of interconnected tracks is formed on the dielectric surface.

23. The method as claimed in claim 1, wherein the metal powder has a grain diameter in the range of about 100 nm to 5000 nm.

24. The method as claimed in claim 1, wherein the metal powder has a grain diameter in the range of about 10 nm to 100 nm.

25. The method as claimed in claim 1, wherein the dielectric material is selected from the group consisting of refractory dielectric oxides, polymers, polymer alloys, composites of refractory dielectric oxides, composites of polymers and composites of polymer alloys.

26. The method as claimed in claim 1, wherein the dielectric material is selected from the group consisting of a monocrystal, a polycrystal, a powder, a glass, a fiber, and a film deposited onto a metal or insulator substrate.

27. The method as claimed in claim 26, wherein the powder has a variable grain size.

28. The method of claim 26, wherein the powder has a uniform grain size.

* * * * *